US011961384B2

United States Patent
Schmidt et al.

(10) Patent No.: US 11,961,384 B2
(45) Date of Patent: Apr. 16, 2024

(54) DEVICE FOR SENSING THE ACTIVITY OF PEOPLE OR THE STATUS OF INFRASTRUCTURES OR OBJECTS INFLUENCED BY PEOPLE

(71) Applicant: EnOcean GmbH, Oberhaching (DE)

(72) Inventors: Frank Schmidt, Munich (DE); Oliver Sczesny, Aschheim (DE)

(73) Assignee: ENOCEAN GMBH, Oberhaching (DE)

(*) Notice: Subject to any disclaimer, the term of this patent is extended or adjusted under 35 U.S.C. 154(b) by 254 days.

(21) Appl. No.: 17/420,535

(22) PCT Filed: Jan. 3, 2020

(86) PCT No.: PCT/EP2020/050074
§ 371 (c)(1),
(2) Date: Jul. 2, 2021

(87) PCT Pub. No.: WO2020/141214
PCT Pub. Date: Jul. 9, 2020

(65) Prior Publication Data
US 2022/0084388 A1 Mar. 17, 2022

(30) Foreign Application Priority Data
Jan. 4, 2019 (DE) .......................... 102019100105.6

(51) Int. Cl.
*G08B 21/22* (2006.01)
*B81B 7/00* (2006.01)
(Continued)

(52) U.S. Cl.
CPC ............... *G08B 21/22* (2013.01); *B81B 7/008* (2013.01); *G01P 15/18* (2013.01); *H04Q 9/00* (2013.01); *B81B 2201/02* (2013.01)

(58) Field of Classification Search
None
See application file for complete search history.

(56) References Cited

U.S. PATENT DOCUMENTS 10,096,230 B2 * 10/2018 Glynn ................. G08B 21/0446
10,929,735 B1 * 2/2021 Zarakas ................. H04W 4/80
(Continued)

FOREIGN PATENT DOCUMENTS

| CA | 2114835 A1 | 2/1993 |
| CA | 2685970 A1 | 5/2010 |

(Continued)

OTHER PUBLICATIONS

Examination Report in related Japanese Patent Application No. 2021-538737, in Japanese, dated May 9, 2023 (3 pages).
(Continued)

*Primary Examiner* — K. Wong
(74) *Attorney, Agent, or Firm* — Nixon Peabody LLP

(57) ABSTRACT

An apparatus for detecting the activity of persons or the state of infrastructures or objects influenced by persons by means of acceleration measurement. The device has an acceleration sensor which is arranged to react to a preset threshold value of a measured acceleration and, when the threshold value is exceeded, to trigger at least one of the actions of data storage, modification of a counter or transmission of a data telegram by radio. The apparatus further comprises an energy converter for converting a primary energy into electrical energy for operating the apparatus or the acceleration sensor. The energy converter is arranged to obtain the primary energy independently of an energy resulting from a measured acceleration.

18 Claims, 1 Drawing Sheet

(51) Int. Cl.
    *G01P 15/18*     (2013.01)
    *H04Q 9/00*     (2006.01)

(56) References Cited

U.S. PATENT DOCUMENTS

| | | |
|---|---|---|
| 2005/0030177 A1 | 2/2005 | Albsmeier |
| 2005/0046580 A1 | 3/2005 | Miranda-Knapp |
| 2009/0212626 A1 | 8/2009 | Snyder et al. |
| 2010/0315196 A1 | 12/2010 | Schmidt |
| 2013/0276541 A1 | 10/2013 | Busch |
| 2014/0013851 A1 | 1/2014 | van Liempd |
| 2015/0008872 A1 | 1/2015 | Tsukasa et al. |
| 2017/0208890 A1 | 7/2017 | Torvinen |

FOREIGN PATENT DOCUMENTS

| | | |
|---|---|---|
| CN | 1836957 A | 9/2006 |
| CN | 101728844 A | 6/2010 |
| CN | 101893946 A | 11/2010 |
| DE | 102005042568 B3 | 1/2007 |
| DE | 102007037896 A1 | 2/2009 |
| DE | 102012015188 A1 | 2/2014 |
| DE | 102016201152 A1 | 7/2017 |
| EP | 2211319 A1 | 7/2010 |
| EP | 2866537 | 4/2015 |
| GB | 2367173 A | 3/2002 |
| JP | H07-59271 A | 3/1995 |
| JP | H11-230790 A | 8/1999 |
| JP | 2000-175373 A | 6/2000 |
| JP | 2008168761 A | 7/2008 |
| JP | 2015015848 A | 1/2015 |
| JP | 2016095771 A | 5/2016 |
| JP | 2016-184800 A | 10/2016 |
| KR | 10-2018-0001827 A | 1/2018 |
| WO | WO 03/034366 A1 | 4/2003 |
| WO | WO 2018/029193 A1 | 2/2018 |

OTHER PUBLICATIONS

International Search Report and Written Opinion of International Searching Authority corresponding to International Patent Application No. PCT/EP2020/050074, with English translation of both, dated Apr. 3, 2020 (19 pages).

Examination Report in related Korean Patent Application No. 10-2021-7024591, in Korean, dated July 10, 2023 (10 pages).

Microelectromechanical Systems; "The MEMS Accelerometer"; published Dec. 4, 2009; in Korean; retrieved from https://www.epac.co/kr/news/articleview.html (5 pages).

Examination Report in related Japanese Patent Application No. 2021-538737, in Japanese, dated Jan. 30, 2024 (6 pages).

* cited by examiner

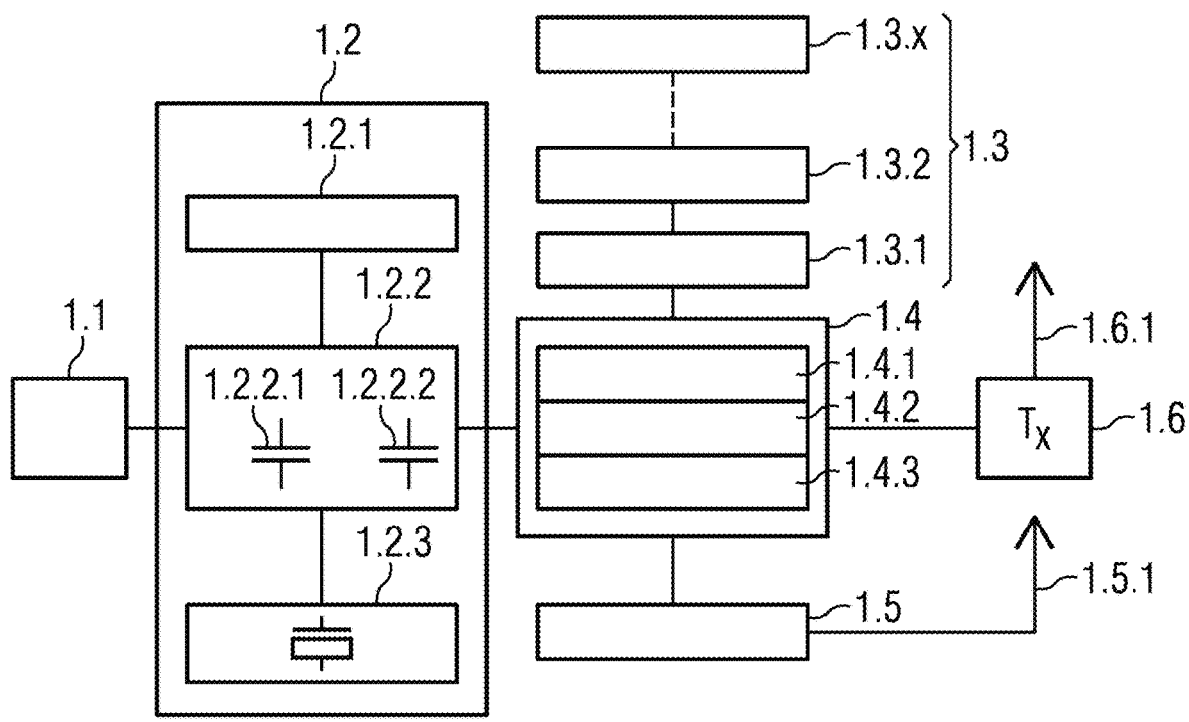

DEVICE FOR SENSING THE ACTIVITY OF PEOPLE OR THE STATUS OF INFRASTRUCTURES OR OBJECTS INFLUENCED BY PEOPLE

CROSS-REFERENCE TO RELATED APPLICATIONS

This application is a U.S. National Stage of International Application No. PCT/EP2020/050074, filed Jan. 3, 2020, which claims the benefit of German Patent Application No. 102019100105.6, filed Jan. 4, 2019, both of which are incorporated herein by reference in their entireties.

TECHNICAL FIELD

The invention relates to an apparatus for detecting the activity of persons or the state of infrastructures or objects influenced by persons. The invention further relates to a method for detecting the activity of persons or the state of infrastructures or objects influenced by persons.

BACKGROUND

It is often desired to determine the local presence of persons or objects (in places, in rooms, at work or sitting places, etc.), as well as the status of infrastructure, equipment, work materials or consumable materials, etc. influenced by persons.

There are already various sensors, especially wired sensors, which can register the presence and activities of people in the environment. Examples are motion detector sensors, such as so-called PIR sensors (PIR=English: passive infrared), with which persons are detected by movement, or cameras, which obtain information about the number of persons, their movement profile, and the influenced infrastructure or devices by evaluating moving images. Other examples are sensors which detect the movement of objects, e.g. by vibration, e.g. glass breakage sensors or door contacts.

The previous solutions of the type described have various disadvantages. The mentioned apparatus or sensors usually have a wired power supply, which limits their flexibility. PIR sensors can also only register moving heat sources (people). They do not work for inanimate objects, nor do they work for people who are only moving a little. Cameras are often not allowed to be used to record/process images of people for privacy reasons.

Problem to be Solved

It is an object of the invention to describe an apparatus as well as a method of the kind mentioned above, which are flexible and versatile and overcome the disadvantages mentioned.

DESCRIPTION OF THE INVENTION

According to a first aspect, an apparatus according to one or more implementations is described below. Further implementations are disclosed in the patent claims.

The apparatus is set up to detect the activity of persons or the state of infrastructures or objects influenced by persons by means of acceleration measurement. The apparatus has at least one acceleration sensor for measuring an acceleration. The acceleration sensor is set up to respond to a preset threshold value of a measured acceleration. The acceleration sensor is set up to trigger at least one of the following actions when the threshold value is exceeded:

Data storage,
Modification of a counter or
Transmission of a data telegram by radio.

The apparatus has an energy converter for converting a primary energy into electrical energy for operating the apparatus or the acceleration sensor. The energy converter is arranged to obtain the primary energy independently of an energy resulting from a measured acceleration.

Such an apparatus can be operated self-sufficiently in terms of energy. The electrical energy required for operation can be obtained from a primary energy via the energy converter. The apparatus is thereby arranged to obtain the primary energy independently of an energy resulting from a measured acceleration. In this way, the apparatus is independent of an energy resulting from a measured acceleration for its operation via electrical energy. Even if no acceleration is sensed, the apparatus can be operated via a separate (environmental) primary energy. In particular, the apparatus does not require a wired power supply.

Via the acceleration sensor, which is set up to measure an acceleration, in a variety of applications activity, presence, operation, etc. of persons, devices, machines, etc. can be detected, which trigger/generate an acceleration force due to shock, vibration, actuation, etc., which can be detected via the acceleration sensor.

The apparatus is therefore flexible and versatile. Through the apparatus, the determination of the local presence of persons and their level of activity, as well as the determination of the status of infrastructure and equipment influenced by people can be done in a simple way in many different applications. For example, the presence of people in specific locations, in rooms, at seats, workstations, berths, beds, in vehicles, etc., as well as their activity at these locations, if any, can be detected. Furthermore, the occupancy/occupancy rate of seats, lounges, workplaces, beds, rooms, halls, or even consumption states of devices, machines, material, filling levels, stock-keeping, etc. can be detected or recognized. This results in a multitude of applications in sanitary, clinical, private, public and industrial environments. It is also possible to determine the location of a person or an object as well as to localize it.

In all these application scenarios, acceleration is detected by vibration, movement, actuation or other influence on the person wearing the apparatus, the apparatus itself or an apparatus or machine coupled to the apparatus. The detection of the acceleration then enables the sensory or device-internal or also external further processing of this information on the basis of the triggered actions explained above. These actions may be performed, for example, in or controlled by a microcontroller or microcontroller unit. For this purpose, the apparatus can have one or more of the components microcontroller/microcontroller unit, (data) memory (possibly implemented in microcontroller/microcontroller unit), counter/register (possibly implemented in microcontroller/microcontroller unit) or radio transmitter.

Threshold values/limit values of an acceleration can be detected in the apparatus of the type explained. If a measured acceleration (or its change) exceeds one or more preset threshold values, certain actions of the type explained or other actions are triggered. If a measured acceleration (or its change) remains below one or more preset thresholds, either no actions are taken or other actions are taken. In this respect, the apparatus is set up for threshold measurement or threshold detection. In particular, there is no need to perform a spectral analysis of acceleration curves, as is the case, for example, with vibration analysis on machines or bridges. The apparatus of the type explained merely determines whether predefined threshold values have been exceeded or periodically determines and transmits current acceleration values. In this way, the apparatus is easy to implement.

In various implementations of the apparatus, the acceleration sensor is designed as a uniaxial or multiaxial, (integrated) acceleration sensor, in particular in MEMS design. For example, an excitation of a uniaxial or multi-axial micromechanics of the acceleration sensor is performed by applying forces, e.g. oscillating forces, vibration, etc., to the apparatus or the acceleration sensor, which act in one or more spatial directions on one or more mass or oscillating elements of the micromechanics of the acceleration sensor and excite them.

In various implementations of the apparatus, the acceleration sensor is designed to detect the acceleration of gaseous media, in particular as a microphone. This results in possible applications for the detection of airborne sound or structure-borne sound.

In various implementations of the apparatus, the apparatus further comprises one or more of the following components:

Microphone, especially for recording airborne sound,
Gas sensor, in particular for measuring $CO_2$ and/or other air gases,
Temperature sensor,
Humidity sensor, especially for measuring the humidity of the ambient air,
Magnetic contact, Hall sensor, especially for detecting the approach of magnets,
Distance sensor, in particular ultrasonic sensor, light sensor or inductive sensor,
Voltage sensor, especially for measuring the energy state or energy level of the electrical energy converted from primary energy within the apparatus,
Brightness sensor,
Button for manual operation of the apparatus.

Additional implementation of one or more of these components can improve acceleration detection and inference when using multiple sensors/components whose data can be combined/fused.

Furthermore, the operation of the apparatus itself can also be improved through the use of various sensors/components that provide a fused indication of the operating behavior to be controlled.

According to a second aspect, an apparatus according to one or more implementations is described below. Further implementations are disclosed in the patent claims.

The apparatus is set up to detect the activity of people or the state of infrastructures or objects influenced by people. The device has at least two sensors. The sensors are arranged to measure different physical quantities. One or more or all of the sensors are set up to respond to a preset threshold value of the respective measured physical quantity and to trigger at least one of the following actions when the threshold value of the measured physical quantity is exceeded:

Data storage,
Modification of a counter or
Transmission of a data telegram by radio.

The apparatus has an energy converter for converting a primary energy into electrical energy for operating the apparatus or one or more or all of the sensors. The energy converter is arranged to obtain the primary energy independently of an energy resulting from the respective measured physical quantity.

The at least two sensors may each be a sensor of the following type:

Accelerometer, especially of the type explained above,
Microphone, especially for recording airborne sound,
Gas sensor, in particular for measuring $CO_2$ and/or other air gases,
Temperature sensor,
Humidity sensor, especially for measuring the humidity of the ambient air,
Magnetic contact, Hall sensor, especially for detecting the approach of magnets,
Distance sensor, in particular ultrasonic sensor, light sensor or inductive sensor,
Voltage sensor, especially for measuring the energy state or energy level of the electrical energy converted from primary energy within the apparatus,
Brightness sensor.

However, the sensors may also be set up, implemented, or configured in other ways.

In various implementations of the apparatus, the apparatus has a push button for manual operation of the apparatus.

Such an apparatus can be operated self-sufficiently in terms of energy. The electrical energy required for operation can be obtained from a primary energy via the energy converter. In this case, the apparatus is set up to obtain the primary energy independently of an energy resulting from the respective measured physical quantity. In this way, the apparatus is independent of an energy resulting from a measured physical quantity for its operation via electrical energy. Even if no significant value of a measured physical quantity is detected, the apparatus can be operated via a separate (environmental) primary energy. In particular, the apparatus does not require a wired power supply.

Via the at least two sensors set up to measure different physical quantities, in a variety of use cases activity, presence, operation, etc. of people, devices, machines, etc. can be detected, which are detectable by changing the measured physical quantities (e.g. acceleration, temperature, (air) humidity, sound, gas, magnetic effects, distance, light/illumination). By applying multiple sensors, detection can also be improved because multiple types of sensing can be combined/fused.

Furthermore, the operation of the apparatus itself can also be improved by the use of different sensors, which allow a fused statement about the operating behavior to be controlled.

The apparatus is therefore flexible and versatile. Through the apparatus, the determination of the local presence of people and their level of activity, as well as the determination of the status of infrastructure and equipment influenced by people can be done in a simple way in many different applications. For example, the presence of people in specific locations, in rooms, at seats, workstations, berths, beds, in vehicles, etc., as well as their activity at these locations, if any, can be detected. Furthermore, the occupancy/occupancy rate of seats, lounges, workplaces, beds, rooms, halls, or even consumption states of devices, machines, material, filling levels, stock-keeping, etc. can be detected or recognized. This results in a multitude of applications in sanitary, clinical, private, public and industrial environments. It is also possible to determine the location of a person or an object as well as to localize it.

In all of these application scenarios, a change in various physical variables is detected by at least two sensors or the physical variables are otherwise influenced by the person wearing the apparatus, the apparatus itself or an apparatus or machine coupled to the apparatus. The detection of the change of the different physical quantities then enables the sensory or device-internal or also external further processing of this information on the basis of the triggered actions explained above.

With the apparatus of the explained type, respective threshold values/limit values of the different physical quantities or their changes can be detected. If a measured physical quantity or its change exceeds one or more preset threshold values, certain actions of the type explained or other actions are triggered. If a measured physical quantity or its change remains below one or more preset threshold values, either no actions are taken or other actions are taken. In this respect, the apparatus is set up for threshold measurement or threshold detection. In particular, there is no need to perform a spectral analysis of physical quantities or changes thereof. The apparatus of the explained type merely determines the exceeding of predetermined threshold values or periodically determines and transmits current values of the measured physical quantities or their changes. In this way, the device is easy to implement.

The further implementations discussed below may be implemented in an apparatus according to the first aspect above, as well as in an apparatus according to the second aspect above.

In various implementations of the apparatus, the energy converter includes a solar cell, where the primary energy is light energy. This represents a simple way to obtain electrical energy from ambient energy, namely light energy.

In various implementations of the apparatus, the energy converter comprises an electromechanical converter, a thermal converter, or a magnetic converter, or a combination thereof. Optionally, the energy converter may also include a solar cell in these implementations. This represents further means of generating electrical energy from various environmental or ambient energies.

In various implementations of the apparatus, the apparatus further comprises an energy storage device. The energy storage device is set up to store the electrical energy converted from the primary energy via the energy converter. In this way, the apparatus can be operated even if no primary energy source is available (in the short or medium term), e.g. in the case of light energy at night.

In various implementations of the apparatus, the apparatus further comprises a charge management device for managing the charge of the energy storage device. The charge management device is arranged to control a limitation of the charging voltage to a maximum value and to control, limit or stop an energy consumption of the apparatus below a predetermined minimum voltage of the energy storage device. This has the advantage that the apparatus, in particular the energy storage device, is protected against overvoltage and/or deep discharge.

In various implementations of the apparatus, the energy storage device includes a first energy storage and a second energy storage. The first energy storage has a higher storage capacity than the second energy storage. The second energy storage has a lower internal resistance than the first energy storage. The first energy storage and the second energy storage are arranged to store the electrical energy converted from the primary energy via the energy converter. Such a combination of two energy storages makes it possible to meet conflicting requirements for long run times without (periodic) ambient/primary energy (e.g., several days without light in buildings) and for immediate operational readiness as soon as ambient/primary energy is available.

In various implementations of the apparatus, the first energy storage and the second energy storage are connected via one or more diodes in such a way that electrical energy can be transferred from the first energy storage to the second energy storage, but not from the second energy storage to the first energy storage. This prevents the second energy storage (with smaller storage capacity) from discharging its energy towards the first (large) energy storage. However, the second energy storage can be charged with electrical energy relatively quickly from the primary energy and therefore realizes a very fast or immediate operational readiness. However, if the second energy storage is discharged due to the operation of the device, it can be (re)charged from the first energy storage (assuming it has reached a sufficient energy level). The first energy storage therefore realizes a long runtime without (periodic) ambient/primary energy.

In various implementations of the apparatus, the second energy storage is connected such that electrical energy for operating the apparatus or individual components of the apparatus can be drawn from the second energy storage and the second energy storage can be recharged by electrical energy from the first energy storage. In these implementations, the second energy storage is the primary energy storage from which electrical energy is drawn to operate the apparatus or individual components. The second energy storage can be recharged by the first energy storage.

In various implementations of the apparatus, the apparatus further comprises an energy storage auxiliary device. The energy storage auxiliary device is arranged separately from the energy storage device for providing an electrical auxiliary energy for operating the apparatus or individual components of the apparatus. The energy storage auxiliary device enables operation of the apparatus or individual components of the apparatus if no primary energy is available (in the medium or long term) and the first energy storage or the second energy storage can no longer provide sufficient electrical energy. The energy storage auxiliary device can be, for example, a battery (e.g. alkaline battery or lithium battery).

In various implementations of the apparatus, the apparatus further comprises a microcontroller. In various implementations of the apparatus, the apparatus further comprises a data memory. The data memory may be located within the microcontroller. In various implementations of the apparatus, the apparatus further comprises a software program for controlling the microcontroller. The software program may be stored within the data memory. In various implementations of the apparatus, the apparatus further comprises a radio transmitter.

The microcontroller and/or the software program can be implemented in such a way that control of processes within the apparatus takes place in response to a trigger signal. Alternatively or additionally, the microcontroller and/or the software program can be implemented in such a way that periodic processes are controlled which can be started repeatedly according to preset or randomly selected time periods.

In various implementations of the apparatus, the apparatus further comprises a wireless interface, particularly a near-field communication interface, for wireless communication and/or data exchange and/or power transfer with other apparatus.

According to a third aspect, a method according to one or more implementations is described below. Further implementations are disclosed in the patent claims.

The method is implemented to detect the activity of persons or the state of infrastructures or objects influenced by persons by means of acceleration measurement. An acceleration is measured by an acceleration sensor. The acceleration sensor is implemented, for example, in an apparatus. The acceleration sensor reacts to a preset threshold value of the measured acceleration. At least one of the following actions is triggered by the acceleration sensor when the threshold value is exceeded:

Data storage,
Modification of a counter or
Transmission of a data telegram by radio.

In the method, the acceleration sensor is operated by an electrical energy obtained from a primary energy. The primary energy is obtained independently of any energy resulting from the measured acceleration.

This method likewise enables the advantages as explained above in connection with an apparatus according to the first or second aspect.

In various implementations of the method where the accelerometer is implemented in an apparatus, the apparatus has the energy converter that converts a primary energy into electrical energy to power the device or the accelerometer. The accelerometer is operated using the electrical energy obtained from the primary energy. The energy converter obtains the primary energy independently of an energy resulting from the measured acceleration.

In various implementations of the method in which the accelerometer is implemented in an apparatus, the apparatus includes an energy storage device that stores electrical energy converted from primary energy via the energy converter. The energy storage device includes a first energy storage and a second energy storage. The first energy storage has a higher storage capacity than the second energy storage. The second energy storage has a lower internal resistance than the first energy storage. The first energy storage and the second energy storage store electrical energy converted from primary energy via the energy converter.

According to a fourth aspect, a method according to one or more implementations is described below. Further implementations are disclosed in the patent claims.

The method is implemented to detect the activity of persons or the state of infrastructures or objects influenced by persons by evaluating at least two different physical quantities. A measurement of at least two different physical quantities is performed by at least two different sensors. The sensors are implemented, for example, in an apparatus. A reaction of one or more or all of the at least two sensors to a preset threshold value of the respective measured physical quantity takes place. At least one of the following actions is triggered by at least one reacting sensor when the threshold value is exceeded:

Data storage,
Modification of a counter or
Transmission of a data telegram by radio.

In the method, one or more or all of the at least two sensors are operated by an electrical energy derived from a primary energy. The primary energy is obtained independently of an energy resulting from the respective measured physical quantities.

This method likewise enables the advantages as explained above in connection with an apparatus according to the first or second aspect.

In various implementations of the method where the sensors are implemented in an apparatus, the apparatus has the energy converter that converts a primary energy into electrical energy to power the apparatus or sensors. The sensors are operated using the electrical energy obtained from the primary energy. The energy converter obtains the primary energy independently of an energy resulting from the respective measured physical quantities.

In various implementations of the method in which the sensors are implemented in an apparatus, the apparatus includes an energy storage device that stores electrical energy converted from primary energy via the energy converter. The energy storage device includes a first energy storage and a second energy storage. The first energy storage has a higher storage capacity than the second energy storage. The second energy storage has a lower internal resistance than the first energy storage. The first energy storage and the second energy storage store electrical energy converted from primary energy via the energy converter.

In the following, further aspects are explained which can be applied or implemented in an apparatus and/or a method of the type explained above. Alternatively, these aspects can also be applied or implemented in a single sensor.

Aspect 1: Apparatus/sensor for measuring the activity of persons and the state of infrastructures or objects affected by persons by means of acceleration measurement, characterized by:

Use of at least one acceleration sensor which reacts to preset threshold values in that, when this threshold value is exceeded, at least one of the actions of data storage, modification of a counter, transmission of a data telegram by radio takes place, and wherein the device/sensor is operated in an energy-autonomous manner by means of an energy converter.

Aspect 2: The device/sensor according to aspect 1, wherein two energy storage devices are used, one of which has a comparatively high storage capacity, while the second has a low internal resistance.

Aspect 3: Device/sensor according to aspect 1 or 2, wherein a device for charge management of an energy storage device or the two energy storage devices is used, which both realizes a limitation of the charge voltage to a maximum value and protects the energy storage device or devices from deep discharge by switching off all or all essential loads below a critical voltage.

Aspect 4: Device/sensor according to any of aspects 1 to 3, with a further (energy) storage device that ensures energy supply during energetically critical situations.

Aspect 5: The device/sensor according to any one of aspects 1 to 4, powered by ambient energy, wherein the energy converter is a solar cell.

Aspect 6: The device/sensor according to any one of aspects 1 to 5, operated with ambient energy, wherein the energy transducer is an electromechanical transducer, a thermal transducer, or a magnetic transducer.

Aspect 7: The device/sensor according to any one of aspects 1 to 6, comprising, in addition to a radio interface, a further wireless interface capable of transmitting data and power.

Aspect 8: The device/sensor according to any one of aspects 1 to 7, wherein an accelerometer is used that is a multi-axis accelerometer implemented in MEMS technology that can measure acceleration.

Aspect 9: The device/sensor according to any one of aspects 1 to 8, which uses at least a further one of the following sensors:

microphones for recording airborne sound,
gas sensors ($CO_2$ and other air gases),
Temperature sensors,
Humidity sensors (humidity of the ambient air),
Magnetic contacts, Hall sensors (approach of magnets),
distance sensors (ultrasonic, light or inductive),
voltage sensors (own energy state of the storages),
brightness sensor,
button for manual operation.

Aspect 10: The device/sensor according to any one of aspects 1 to 9, comprising a microcontroller configured to control operations in response to a trigger signal and periodic operations that can be started repeatedly according to preset or randomly selected time periods.

Aspect 11: Device/sensor for measuring the activity of persons and the state of infrastructures or objects influenced by persons by means of evaluation of at least two measuring sensors for different physical quantities, characterized in that when a preset threshold of at least one of the measuring sensors is exceeded, at least one of the actions: Data storage, modification of a counter, transmission of a data telegram by radio, and wherein the device/sensor is operated in an energy-autonomous manner by means of a solar cell.

Aspect 12: The device/sensor according to aspect 11, wherein two energy storage devices are used, one of which has a comparatively high storage capacity, while the second has a low internal resistance.

Aspect 13: Device/sensor according to aspect 11 or 12, wherein a device for charge management of an energy storage device or the two energy storage devices is used, which both realizes a limitation of the charge voltage to a maximum value and protects the energy storage device(s) from deep discharge by switching off all or all essential loads below a critical voltage.

Aspect 14: Device/sensor according to any one of aspects 11 to 13, with a further (energy) storage device that ensures the energy supply during energetically critical situations.

Aspect 15: The device/sensor according to any one of aspects 11 to 14, powered by ambient energy, wherein the energy converter is a solar cell.

Aspect 16: The device/sensor according to any one of aspects 11 to 15, operated with ambient energy, wherein the energy transducer is an electromechanical transducer, a thermal transducer, or a magnetic transducer.

Aspect 17: The device/sensor according to any one of aspects 11 to 16, comprising, in addition to a radio interface, a further wireless interface capable of transmitting data and power.

Aspect 18: The device/sensor according to any one of aspects 11 to 17, wherein an accelerometer is used that is a multi-axis accelerometer implemented in MEMS technology that can measure acceleration.

Aspect 19: The device/sensor according to any one of aspects 11 to 18, which uses at least a further one of the following sensing elements:
microphones for recording airborne sound,
gas sensors ($CO_2$ and other air gases),
Temperature sensors,
Humidity sensors (humidity of the ambient air),
Magnetic contacts, Hall sensors (approach of magnets),
distance sensors (ultrasonic, light or inductive),
voltage sensors (own energy state of the storages),
brightness sensor,
button for manual operation.

Aspect 20: The device/sensor according to any one of aspects 11 to 19, comprising a microcontroller configured to control operations in response to a trigger signal and periodic operations that can be started repeatedly according to preset or randomly selected time periods.

Any structural features, implementations, and aspects of the devices (apparatus)/sensors explained above may be considered, applied, or reflected in steps, processes, measures, and implementations of the methods explained above, and vice versa.

DETAILED DESCRIPTION

The invention is explained in more detail below by means of an embodiment with the aid of a drawing.

FIG. 1 shows a schematic block diagram of an embodiment of a apparatus for detecting the activity of persons or the state of infrastructures or objects influenced by persons.

A central element is an acceleration sensor (sensor 1.3.1). The acceleration sensor 1.3.1 is preferably a multi-axis, integrated acceleration sensor in MEMS design. Other acceleration sensors that respond to the acceleration of solid bodies can also be used, such as mechanical acceleration threshold switches or piezoelectric acceleration sensors.

Further sensors 1.3.2 to 1.3.x can also be optionally implemented. The sensors (sensor group) 1.3 are generally set up to detect (different) physical variables. More details are explained below.

Further components in the embodiment according to FIG. 1 are a microcontroller unit 1.4. This comprises a microcontroller 1.4.2 with storage facility/memory 1.4.3 (for data, information, code, etc.) and a software program 1.4.1 of the microcontroller (for its control). Furthermore, a radio transmitter (radio transmitter/radio transmitter) 1.6 with antenna 1.6.1 as well as an energy supply unit 1.2 and an energy source or energy converter 1.1 for a primary energy are arranged.

In the embodiment according to FIG. 1, the energy source or energy converter 1.1 comprises, for example, a solar cell which converts ambient light (as primary energy) into an electrical voltage (electrical energy). Furthermore, the energy supply unit 1.2 comprises an energy management circuit (charge management device) 1.2.1, which controls the charging of one or more electrical energy storages 1.2.2.1 and 1.2.2.2 of an energy storage device 1.2.2. The energy management circuit 1.2.1 provides at least the functions of an overvoltage protection and/or a deep discharge protection of the energy storage device 1.2.2.

The storage of electrical energy from the energy source or energy converter 1.1 takes place in the two separate energy storages 1.2.2.1 and 1.2.2.2. This makes it possible to balance the advantages and disadvantages of low-loss energy storages and to operate the device self-sufficiently in terms of energy.

The energy storage 1.2.2.1 has a high storage volume (high storage capacity), but also a high internal resistance of typically >10 Ohm. This energy storage 1.2.2.1 can store the required energy for e.g. several weeks of operation. However, because of its high internal resistance due to its principle, it is rather unsuitable for high current peaks, such as those that occur during the transmitting operation of the radio transmitter 1.6. Typical representatives of these energy storages 1.2.2.1 are so-called double-layer capacitors, supercapacitors (PAS capacitors) with capacities between 0.05 Farad and 100 Farad, or rechargeable electrochemical storage devices with storage capacities between 1 mAh and 5000 mAh.

The energy storage 1.2.2.2 has a much smaller storage volume (small storage capacity) and can only store energy for e.g. a few actions or even only one action, e.g. "measure acceleration+transmit radio telegram". However, the energy storage 1.2.2.2 can supply high electrical currents for a short time, since it has a low internal resistance of typically <1 Ohm due to its principle. Typical representatives of these energy storages 1.2.2.2 are e.g. electrolytic capacitors or tantalum capacitors with capacitance values between 50 µF and 5000 µF.

The two energy storages 1.2.2.1 and 1.2.2.2 are connected via diodes (not shown) in such a way that the low-resistance energy storage 1.2.2.2 is always charged first. Only when its maximum voltage has been reached, energy storage 1.2.2.1 is charged further until also this one reaches its maximum voltage. The decision as to when the charging of the energy storages 1.2.2.2 and 1.2.2.1 is switched over is made by an electronically implemented threshold switch. Only then the charging is interrupted. In the embodiment according to FIG. 1, all functions/components of the device have access to the energy storage 1.2.2.2. Since actions with high current demand are very short (typically between 0.3 and 50 milliseconds) and occur relatively rarely (typically 1 time per day to 1 time every 10 seconds), the energy storage 1.2.2.2 can be well/sufficiently recharged by the energy storage 1.2.2.1 in the pauses between high current calls.

By combining these two energy storages 1.2.2.1 and 1.2.2.2 in this way, it is possible to meet the conflicting requirements for long run times without periodic ambient energy (e.g. long weekends without light in buildings) and for immediate operational readiness as soon as light falls on solar cell 1.1 (energy storage 1.2.2.2 is charged very quickly) both.

Optionally, in the embodiment according to FIG. 1, a further energy storage (energy storage auxiliary device) 1.2.3 can be used, which is designed e.g. as a battery. This energy storage 1.2.3 only comes into operation if, for example, during rare long periods without light, the energy storages 1.2.2.1 and also 1.2.2.2 fall below a certain energy content. Energy storage 1.2.3 can then be used to recharge energy storages 1.2.2.1 and 1.2.2.2. Alternatively, electrical energy can be taken directly from the energy storage 1.2.3 (i.e. without detour of a recharging of the energy storages 1.2.2.1 and 1.2.2.2) for further operation of the apparatus or individual components.

Typical representatives of energy storage 1.2.3 are alkaline batteries or lithium batteries, which are usually not rechargeable, but can store their charge for many years—typically 10 years or more.

The acceleration sensor 1.3.1 (or other sensors from the group of sensors 1.3) is controlled by the microcontroller unit 1.4 in the embodiment according to FIG. 1. Various alternative or supplementary operating modes are possible.

EXAMPLES a) Operating mode. The acceleration sensor 1.3.1 is active and waits in a "low power" mode for at least one previously defined acceleration threshold (threshold value of the acceleration) to be exceeded. In this state, all or some of the circuit blocks/function blocks/components that are not currently required are switched off. As soon as the acceleration reaches or exceeds the set threshold, other circuit blocks/function blocks/components are activated—but at least the microcontroller 1.4, which, depending on the stored software program 1.4.1, controls actions before the system returns to the initial mode. These actions may include all or part of the following: storing the acceleration event, incrementing a counter, broadcasting the event and/or the counter reading by radio (e.g. via radio transmitter 1.6).

b) Furthermore, the transmission of results or alive signs can be done periodically according to an agreed scheme, independent or dependent on the measured acceleration values.

c) No spectral analysis of acceleration curves is performed, as is the case, for example, with vibration analysis on machines or bridges. The method only determines the exceeding of predefined limit values/threshold values or periodically determines and transmits current acceleration values.

d) Flight mode. Since the device is powered by ambient energy and usually does not have a separate off switch, it must be ensured during transport that no radio telegrams are transmitted. For this purpose, the sensor in the embodiment according to FIG. 1 has a push button or other input interface (not shown) with which various operating modes can be switched by a predefined key sequence. In particular, this also includes a flight mode in which no radio telegrams are sent.

Optionally, in addition to the acceleration sensor 1.3.1, further sensors, indicated in FIG. 1 by 1.3.2 to 1.3.x, are used to obtain as much information as possible from the environment of the device.

Examples of useful additional sensors are:
Microphones for recording airborne sound
Gas sensors ($CO_2$ and other air gases)
Temperature sensors
Humidity sensors (humidity of the ambient air)
Magnetic contacts, Hall sensors (approach of magnets)
Distance sensors (ultrasonic, light or inductive)
Voltage sensors (own energy state of the storages)
Brightness sensor
Push button for manual operation.

All the sensors mentioned (list not complete) can usefully supplement the acceleration information and thus provide a more complete picture of activities in the sensor environment. Furthermore, an effective improvement of the false alarm rate can be achieved by evaluating several sensors at the respective point in time.

Another application of additional sensor information is the reduction of the own energy demand.

EXAMPLES a) A light sensor (e.g. sensor 1.3.2) distinguishes between day and night. At night, periodic radio telegrams may not be necessary—the energy can be saved by sending only from a preset minimum brightness.

b) The energy state of the energy storage devices 1.2.2 and/or 1.2.3 is measured periodically (via one or more voltage sensors in sensor group 1.3). If the energy state falls below a predefined threshold due to poor availability of ambient energy, the device could switch to a power-saving operating mode in which, for example, the periodic duty cycles are executed less frequently (but at the expense of real-time capability). In this way, however, the function can be maintained until more energy is available again.

c) Vibrations, e.g. on a table, can serve as a measure of (human) activity in the environment. However, by including airborne sound measurements (e.g. via a microphone in sensor group 1.3) or gas measurements (e.g. $CO_2$ content of the air, measured via a gas sensor in sensor group 1.3), the reliability and accuracy of the statements can be significantly increased. Sources of error, e.g. due to passing trucks or trains or people walking past the table, can potentially be eliminated.

Optionally, in addition to the radio transmitter 1.6, the apparatus has a further wireless interface 1.5, which in particular can make use of the so-called "NFC" technology (Near Field Communication). The characteristic of this technology is that both data and operating energy can be transmitted over short distances (a few cm). The transmission of energy is important, especially for devices that can be operated with ambient energy. This is because the energy storage 1.2.2 or 1.2.3 can be empty. Nevertheless one would like to
communicate,
Read out data,
update the software.

This is to be realized, completely or partially, by the optional interface 1.5. The interface has an antenna 1.5.1 for this purpose.

The embodiment shown is merely selected as an example.

LIST OF REFERENCE SIGNS 1.1 Energy converter/energy source
1.2 Power supply unit
1.2.1 Energy management circuit/charge management device
1.2.2 Energy storage device
1.2.2.1 Energy storage
1.2.2.2 Energy storage
1.2.3 Energy storage/energy storage auxiliary device
1.3 Sensor group
1.3.1 Acceleration sensor
1.3.2 further sensor
1.3.x further sensor
1.4 Microcontroller unit
1.4.1 Software program
1.4.2 Microcontroller
1.4.3 (Data) memory
1.5 Wireless interface
1.5.1 Antenna
1.6 Radio sender/radio transmitter
1.6.1 Antenna

The invention claimed is:

1. An apparatus for detecting the activity of persons or the state of infrastructures or objects influenced by persons by means of acceleration measurement,
   wherein the apparatus comprises at least one acceleration sensor for measuring an acceleration,
   wherein the acceleration sensor is set up to react to a preset threshold value of a measured acceleration and to trigger at least one of the following actions when the threshold value is exceeded:
      data storage,
      modification of a counter or
      transmission of a data telegram by radio, and
   wherein the apparatus comprises an energy converter for converting a primary energy into electrical energy for operating the apparatus or the acceleration sensor, wherein the energy converter is arranged to obtain the primary energy independently of an energy resulting from a measured acceleration,
   wherein the apparatus comprises an energy storage device adapted to store the electrical energy converted from the primary energy via the energy converter, wherein the energy storage device comprises a first energy storage and a second energy storage, wherein the first energy storage has a higher storage capacity than the second energy storage and wherein the second energy storage has a lower internal resistance than the first energy storage, and wherein the first energy storage and the second energy storage are arranged to store the electrical energy converted from the primary energy via the energy converter,
   wherein the first energy storage and the second energy storage are connected via one or more diodes such that electrical energy can be transferred from the first energy storage to the second energy storage, but not from the second energy storage to the first energy storage.

2. The apparatus according to claim 1, wherein the acceleration sensor is designed as a single-axis or multi-axis acceleration sensor, in particular in MEMS design.

3. The apparatus according to claim 1, wherein the acceleration sensor is designed to detect the acceleration of gaseous media, in particular as a microphone.

4. The apparatus according to claim 1, further comprising one or more of the following components:
   microphone, especially for recording airborne sound,
   gas sensor, in particular for measuring $CO_2$ and/or other air gases,
   temperature sensor,
   humidity sensor, especially for measuring the humidity of the ambient air,
   magnetic contact, Hall sensor, especially for detecting the approach of magnets,
   distance sensor, in particular ultrasonic sensor, light sensor or inductive sensor,
   voltage sensor, especially for measuring the energy state or energy level of the electrical energy converted from primary energy within the apparatus,
   brightness sensor,
   button for manual operation of the apparatus.

5. An apparatus for detecting the activity of persons or the state of infrastructures or objects influenced by persons,
   wherein the apparatus comprises at least two sensors which are set up to measure different physical quantities,
   wherein one or more or all of the sensors are set up to react to a preset threshold value of the respective measured physical quantity and to trigger at least one of the following actions when the threshold value of the measured physical quantity is exceeded:
      data storage,
      modification of a counter or
      transmission of a data telegram by radio, and
   wherein the apparatus comprises an energy converter for converting a primary energy into electrical energy for operating the apparatus or one or more or all of the sensors, wherein the energy converter is arranged to obtain the primary energy independently of an energy resulting from the respective measured physical quantity,
   wherein the apparatus comprises an energy storage device adapted to store the electrical energy converted from the primary energy via the energy converter, wherein the energy storage device comprises a first energy storage and a second energy storage, wherein the first energy storage has a higher storage capacity than the second energy storage and wherein the second energy storage has a lower internal resistance than the first energy storage, and wherein the first energy storage and the second energy storage are arranged to store the electrical energy converted from the primary energy via the energy converter;
   wherein the first energy storage and the second energy storage are connected via one or more diodes such that electrical energy can be transferred from the first energy storage to the second energy storage, but not from the second energy storage to the first energy storage.

6. The apparatus according to claim 1, wherein the energy converter comprises a solar cell and the primary energy is light energy.

7. The apparatus according to claim 1, wherein the energy converter comprises an electromechanical converter, a thermal converter, or a magnetic converter, or a combination thereof.

8. The apparatus according to claim 1, further comprising a charge management device for charge management of the energy storage device, wherein the charge management device is arranged to control a limitation of the charging voltage to a maximum value and, below a predetermined minimum voltage of the energy storage device, to control, limit or switch off an energy consumption of the apparatus.

9. The apparatus according to claim 1, wherein the one or more diodes allow electrical energy for operating the apparatus or individual components of the apparatus to be taken from the second energy storage and allow the second energy storage to be recharged by electrical energy from the first energy storage.

10. The apparatus according to claim 1, further comprising an energy storage auxiliary device arranged separately from the energy storage device for providing an auxiliary electrical energy for operating the apparatus or individual components of the apparatus.

11. The apparatus according to claim 1, further comprising a wireless interface, in particular a near-field communication interface, for wireless communication and/or data exchange and/or power transfer with other apparatus.

12. A method for detecting the activity of persons or the state of infrastructures or objects influenced by persons by means of
 acceleration measurement or
 evaluating at least two different physical quantities, the method comprising:
  measurement of
   an acceleration by an acceleration sensor of an apparatus or
   at least two different physical quantities by at least two different sensors of an apparatus,
  reaction of
   the acceleration sensor to a preset threshold value of the measured acceleration or
   one or more or all of the at least two sensors to a preset threshold value of the respective measured physical quantity,
  triggering of at least one of the following actions by
   the acceleration sensor or
   at least one responsive sensor
  when the threshold value is exceeded:
   data storage,
   modification of a counter or
   transmission of a data telegram by radio,
 wherein the apparatus comprises an energy converter which converts a primary energy into electrical energy for operating the apparatus or
  the acceleration sensor or
  the at least two sensors,
 wherein
  the acceleration sensor or
  one or more or all of the at least two sensors is/are operated via the electrical energy obtained from the primary energy and the energy converter obtains the primary energy independently of an energy resulting from
   the measured acceleration or
   the respective measured physical quantities,
 wherein the apparatus has an energy storage device which stores the electric energy converted from the primary energy via the energy converter, wherein the energy storage device comprises a first energy storage and a second energy storage, wherein the first energy storage has a higher storage capacity than the second energy storage and wherein the second energy storage has a lower internal resistance than the first energy storage, and wherein the first energy storage and the second energy storage store the electrical energy converted from the primary energy via the energy converter,
 wherein the first energy storage and the second energy storage are connected via one or more diodes such that electrical energy can be transferred from the first energy storage to the second energy storage, but not from the second energy storage to the first energy storage.

13. The apparatus according to claim 5, wherein the energy converter comprises a solar cell and the primary energy is light energy.

14. The apparatus according to claim 5, wherein the energy converter comprises an electromechanical converter, a thermal converter, or a magnetic converter, or a combination thereof.

15. The apparatus according to claim 5, further comprising a charge management device for charge management of the energy storage device, wherein the charge management device is arranged to control a limitation of the charging voltage to a maximum value and, below a predetermined minimum voltage of the energy storage device, to control, limit or switch off an energy consumption of the apparatus.

16. The apparatus according to claim 5, wherein the one or more diodes allow electrical energy for operating the apparatus or individual components of the apparatus to be taken from the second energy storage and allow the second energy storage to be recharged by electrical energy from the first energy storage.

17. The apparatus according to claim 5, further comprising an energy storage auxiliary device arranged separately from the energy storage device for providing an auxiliary electrical energy for operating the apparatus or individual components of the apparatus.

18. The apparatus according to claim 5, further comprising a wireless interface, in particular a near-field communication interface, for wireless communication and/or data exchange and/or power transfer with other apparatus.

* * * * *